US005373212A

United States Patent [19]

Beau

[11] Patent Number: 5,373,212

[45] Date of Patent: Dec. 13, 1994

[54] DEVICE ENABLING GAS BUBBLES CONTAINED IN A LIQUID COMPOSITION TO BE DISSOLVED

[75] Inventor: Laurent B. Beau, Chalon-Sur-Saone, France

[73] Assignee: Eastman Kodak Company, Rochester, N.Y.

[21] Appl. No.: 192,765

[22] Filed: Feb. 7, 1994

Related U.S. Application Data

[63] Continuation of Ser. No. 9,512, Jan. 27, 1993, abandoned.

[30] Foreign Application Priority Data

Feb. 4, 1992 [FR] France ................................ 92 01430

[51] Int. Cl.[5] ......................... B01F 1/00; H01L 41/08

[52] U.S. Cl. ................................................... 310/316

[58] Field of Search ............... 310/316, 317, 325, 334, 310/337

[56] References Cited

U.S. PATENT DOCUMENTS

| | | | |
|---|---|---|---|
| 3,044,236 | 7/1962 | Bearden et al. | 55/204 |
| 3,608,272 | 9/1971 | Peri et al. | 55/15 |
| 3,853,500 | 12/1974 | Gassmann et al. | 55/15 |
| 4,302,728 | 11/1981 | Nakamura | 310/216 |
| 4,325,255 | 4/1982 | Howard et al. | 73/589 |
| 4,339,247 | 7/1982 | Faulkner et al. | 55/15 |
| 4,398,925 | 8/1983 | Trinh et al. | 55/15 |
| 4,428,757 | 1/1984 | Hall | 55/277 |
| 4,612,018 | 9/1986 | Tsuboi et al. | 55/15 |
| 4,882,525 | 11/1989 | De Meulenaer et al. | 310/316 |
| 4,888,565 | 12/1989 | Littleford et al. | 310/316 |
| 4,926,084 | 5/1990 | Furutsu et al. | 310/316 |
| 4,965,532 | 10/1990 | Sakurai | 310/316 |
| 5,022,899 | 6/1991 | Hohlfeld et al. | 55/277 |
| 5,113,116 | 5/1992 | Wilson | 310/316 |
| 5,151,085 | 9/1992 | Sakurai et al. | 310/316 |

FOREIGN PATENT DOCUMENTS

| | | | |
|---|---|---|---|
| 0442510A1 | 12/1986 | European Pat. Off. | B06B 1/02 |
| 0246528 | 11/1987 | European Pat. Off. | B06B 1/02 |
| 0394583 | 10/1990 | European Pat. Off. | B06B 1/02 |
| 0204372 | 8/1991 | European Pat. Off. | G03C 5/26 |
| WO88/09206 | 12/1988 | WIPO | B01F 1/00 |

*Primary Examiner*—Thomas M. Dougherty
*Attorney, Agent, or Firm*—Carl F. Ruoff

[57] ABSTRACT

The invention concerns a device enabling the gas bubbles present in a liquid composition to be dissolved. The device comprises a chamber (10) provided with an inlet orifice (11) through which the composition to be debubbled is introduced, and an outlet orifice (12) through which the debubbled composition is discharged, an ultrasonic transducer (13, 14, 15, 16, 17, 18, 19, 20), a power supply (21) for supplying the said transducer, the said power supply (21) being regulated in frequency and power at the same time.

7 Claims, 4 Drawing Sheets

DEVICE ENABLING GAS BUBBLES CONTAINED IN A LIQUID COMPOSITION TO BE DISSOLVED

This is a continuation of application Ser. No. 08/009,512, filed Jan. 27, 1993 now abandoned.

The present invention relates to the dissolving of gas bubbles contained in liquid compositions and more particularly concerns a device adapting automatically to any changes in characteristics of the liquid composition to be debubbled.

Many products in the chemical industry, the pharmaceutical industry, the food products industry and related industries, in particular emulsions, suspensions, pastes and high viscosity liquids or similar contain air or gases; which are dissolved or in the form of small bubbles which during manufacture, inevitably come to be incorporated in the liquid but must not occur in the final product. Thus, for example, in the case of photographic emulsion, the gas bubbles greatly impair the quality of the films or photographic papers produced with these emulsions since the bubbles or small gas bubbles disturb the volume flow in the coating devices, thus giving rise to the formation of streaks which make the photographic materials unusable.

FIG. 1, to which reference is now made, shows diagrammatically a conventional photographic emulsion downfeed. According to such a conventional arrangement, the emulsion downfeed includes a vat 1, maintained under agitation, into which the emulsion to be processed is introduced. The emulsion is then conveyed to a preliminary processing device 2, in which a first processing is applied, by means of ultrasonics, in order to allow a rudimentary debubbling of the said emulsion, the term "debubbling" meaning a dissolving of gas bubbles in the composition to be processed. The composition is then carried, by means of a pump 3, to a bubble eliminator 4, which will be designated hereinafter by the initials ECR and in which an ultrasonic processing is also applied for the purpose of reincorporating in the photographic composition any gas bubbles remaining at the end of the preliminary processing. The ECR will be the subject of a more detailed description later. The ECR is powered by means of a power supply 7. The processed solution is then conveyed to a utilization station 8 such as, for example, a photographic coating station.

Generally other devices, for example of the partial vacuum type, not shown, are incorporated upstream of the ECR. Likewise the vat can itself be subjected to ultrasonic vibration in order to eliminate some of the gas bubbles at this stage.

FIG. 2, to which reference is now made, shows in detail an ECR of the type used conventionally for this type of application. These devices, well known in the art, comprise principally a processing chamber 10, for example made from stainless steel, provided with an inlet orifice 11, through which the solution is introduced, and an outlet orifice 12, through which the processed solution is discharged. The ECR also comprises an ultrasonic transducer fitted into a chamber (not shown), which transducer transmits vibrations to a titanium rod 13, disposed in the processing chamber 10, through a diaphragm 14, generally made from titanium.

The transducer is in fact formed by an assembly of crystals and piezoelectric ceramics 16, 17, disposed in a so-called "Langevin triplet" arrangement and capable of expanding and contracting at the same rate as the frequency which is fed to them through the connections 15. The so-called "Langevin triplet" arrangement consists of two piezoelectric discs separated by an intermediate ring. Each of the ceramics 16, 17 has one of its faces connected to earth, the other being connected to the power supply point 21. The two ceramics are insulated by an aluminum ring 18. The transducer also comprises a rear counterweight 19 enabling most of the ultrasonic wave to be reflected back to the titanium rod 13 in con%act with the solution to be processed, the whole being prestressed by means of a bolt 20 which enables the points of repose of the ceramics to be moved, thus allowing the application of stronger electric fields without any risk of having the ceramic rupture under the effect of excessively large tensile stresses, the compressive strength of the ceramic being in fact greater than its tensile strength. Generally the power supply frequency varies between 38 and 43 kHz.

Such an ultrasonic device can, in reality, be likened to a circuit of the RLC type in which the term R corresponds to the electrical resistance related to a mechanical damping due to the diaphragm 14, to the fluid and to the pressure inside the processing chamber 10; the term L corresponds to the mass of the vibrating assembly; the term C corresponds to the interelectrode capacitance, that is to say between the two ceramics 16, 17. In consequence, such as device will function in an optimum manner if, at any time, the frequency of the power supply coincides with the natural resonant frequency of the RLC circuit.

A disadvantage of existing ECRs lies in the fact that the frequency adjustment of the ultrasonic transducer power supply is carried out manually by an operator. This adjustment is in reality carried out once and for all for each batch to be processed and consequently often it becomes inappropriate as the term R varies, in particular because of the wear on the diaphragm 14 or the change in pressure inside the processing chamber 10. Moreover, in certain cases, the adjustment by the operator is carried out by varying the frequency not continuously but discretely, that is to say in steps (of the order of a few hundred hertz). Such a system does not therefore allow precise adjustment of the ultrasonic transducer power supply frequency. The consequence of this is obviously that the yield of the electrical energy/mechanical energy conversion afforded to the titanium rod 13 is not optimum, thus making the debubbling produced in the liquid composition unsatisfactory.

Another problem lies in the power adaptation of the transducer power supply. It is in fact desirable to have an immediate adaptation of the energy transferred to the transducer according to the operating conditions, namely the flow rate, temperature, pressure or viscosity of the composition, without any intervention on the part of the operator. This is necessary when the device is not always used for the same compositions, but for compositions in which certain parameters, in particular the viscosity, change. It is in fact very disadvantageous from the point of view of efficiency to have to repeat the adjustments each time that the composition to be processed is changed.

Thus one object of the present invention is to provide a device making it possible to dissolve the gas bubbles present in an aqueous composition by means of an ultrasonic transducer whose power supply is automatically adapted to the operating parameters and notably to the characteristics of the composition to be processed.

Another object of the present invention is to be able to dispense with the preliminary processing devices existing in conventional installations.

Other objects will become clear in more detail in the following description.

These objects are achieved by producing a device enabling the gas bubbles contained in a liquid composition to be dissolved, comprising:

- a chamber provided with an inlet orifice through which the composition to be debubbled is introduced, and an outlet orifice through which the debubbled composition is discharged;
- an ultrasonic transducer inducing an alternating pressure field inside the said chamber;
- a power supply for supplying the said transducer;

the said device being characterized in that the said power supply is regulated in frequency and power at the same time.

According to one advantageous embodiment the frequency regulation is based on the phase difference between the current and voltage at the ultrasonic transducer terminals.

According to another advantageous characteristic, the device also comprises means enabling an operator to carry out a preliminary adjustment of the frequency, means being provided to indicate to the operator when the preliminary adjustment has been carried out correctly.

Advantageously again, the ultrasonic transducer has a structure of the Langevin triplet type.

During the following description, reference will be made to the drawing in which.

Figure 3:
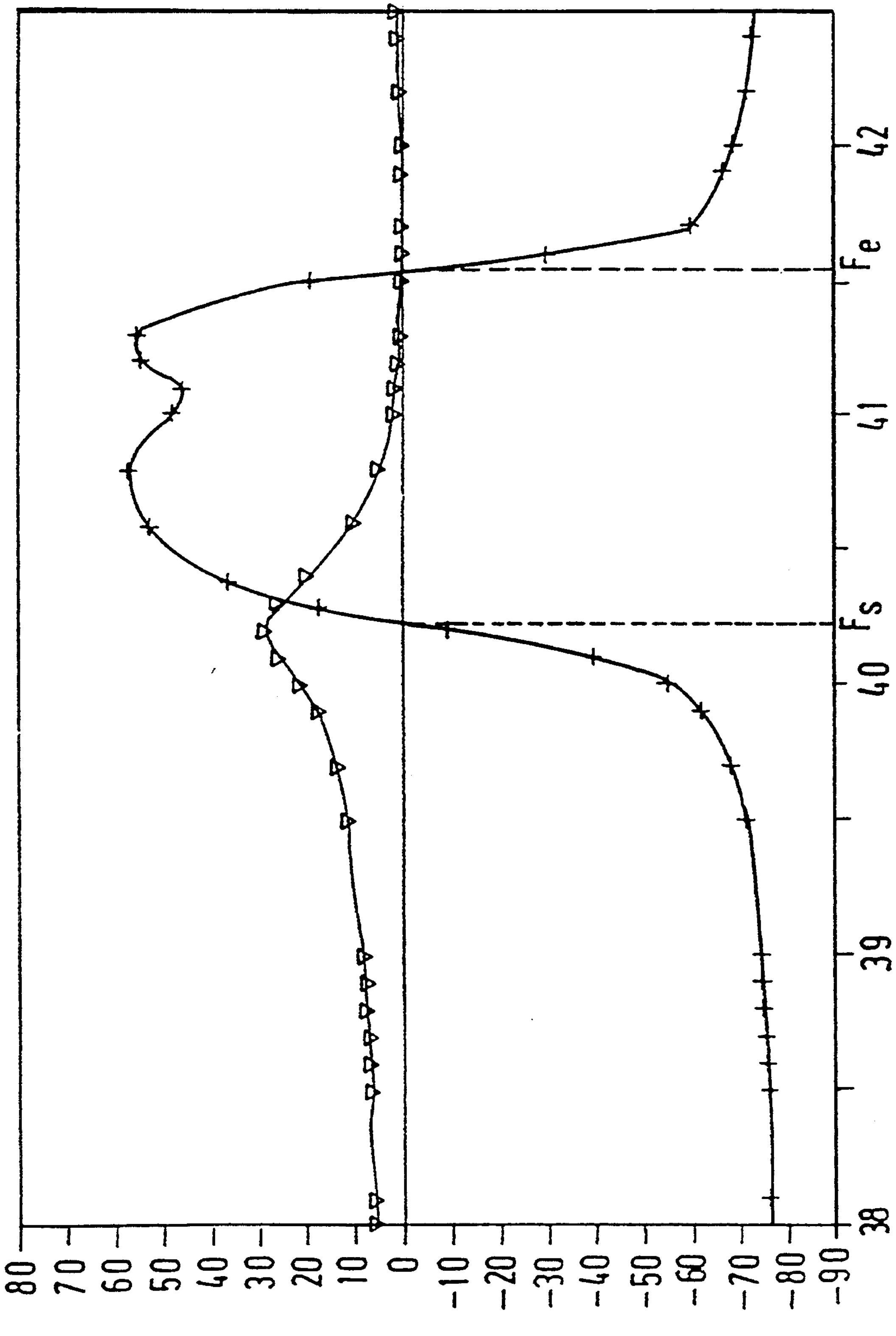
FIG. 3 is a graph showing the current at the terminals the ECR (the curve passing through the points Δ) and the phase difference between the current and voltage (the curve passing through the points +) as a function of the frequency.

According to the present invention, the intention is that the ECR power supply frequency should at all times coincide with the natural resonant frequency of the RLC circuit, corresponding to the ultrasonic transducer, the resonant frequency corresponding to the frequency for which the phase difference between the current and voltage at the terminals of the ECR is zero. From the graph shown in FIG. 3, it is clear that there are two frequencies for which the phase difference is zero: a series resonant frequency $F_s$ for which the current is maximum; a parallel resonant frequency $F_e$ for which the current is minimum. For reasons of yield, the aim will naturally be to opt for the series resonant frequency, that is to say under the conditions where the internal resistance of the system is minimum.

Figure 1:
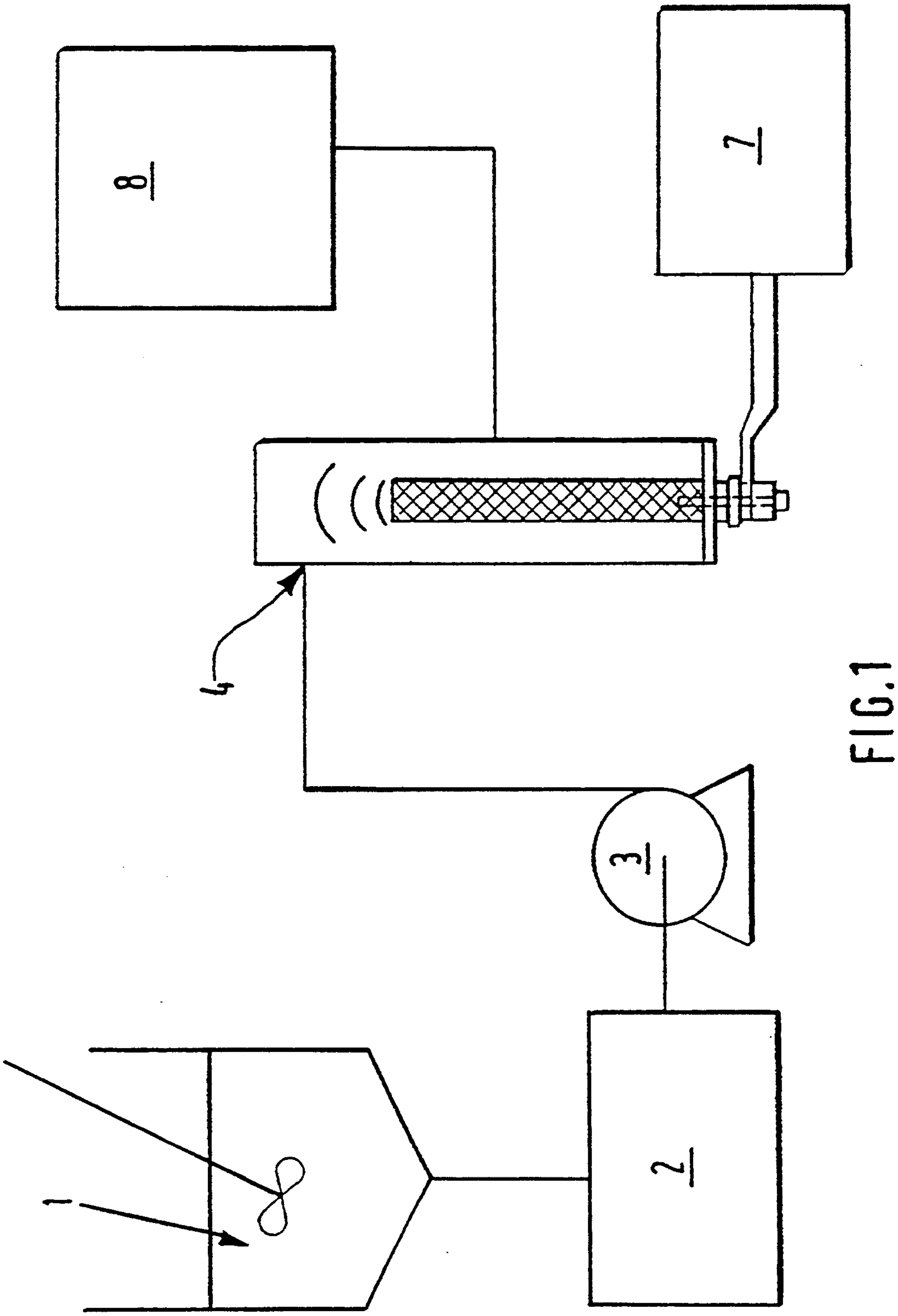
FIG. 1 shows diagrammatically a conventional photographic emulsion downfeed.
Figure 2:
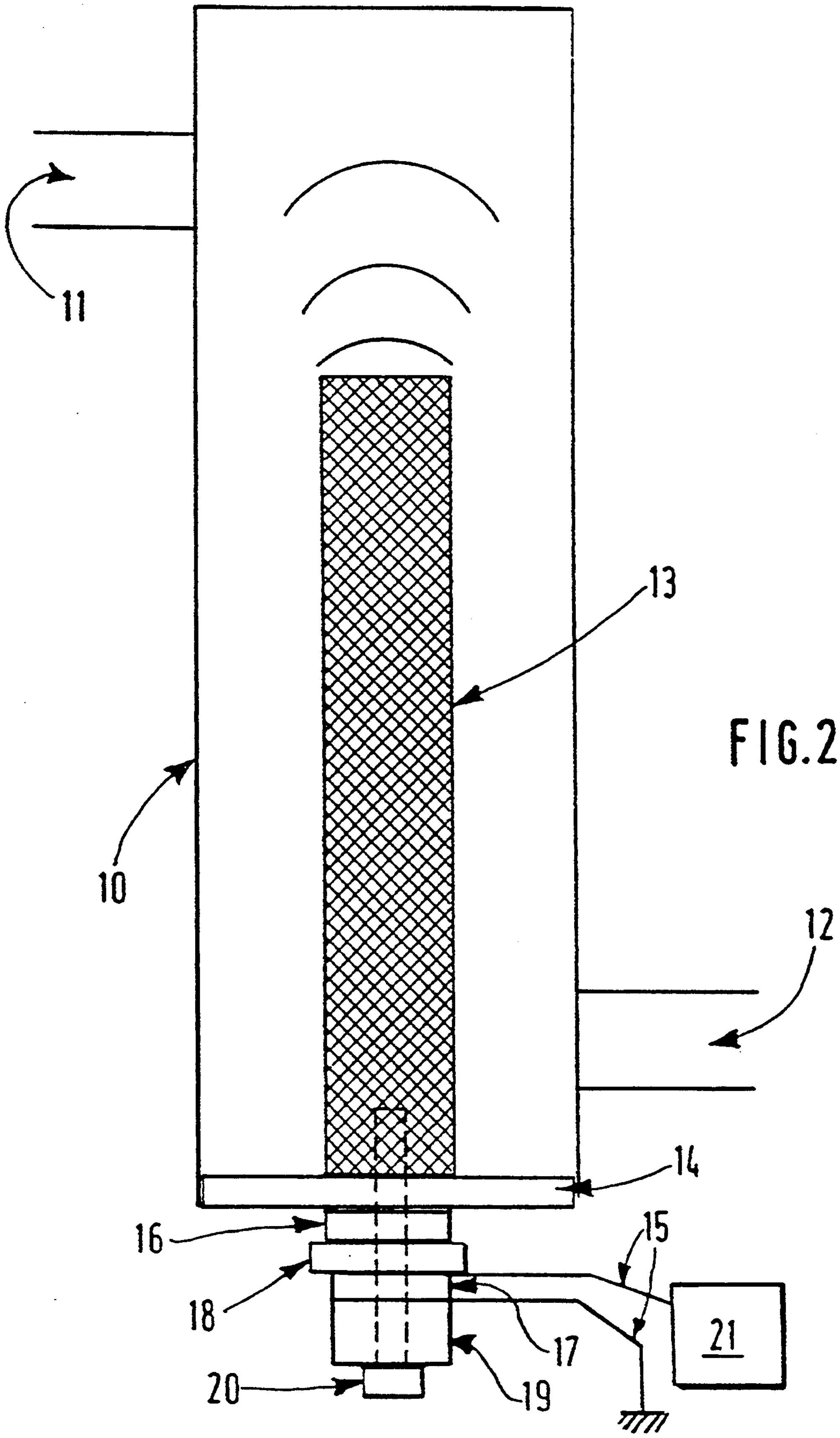
FIG. 2 shows in detail the ultrasonic debubbling device (ECR)

The ECR used according to the present invention is of same type as the one described with reference to FIG. 2 and consequently does not require any additional description. Only the control of the ECR power supply will be the subject of a detailed description.

Figure 4:
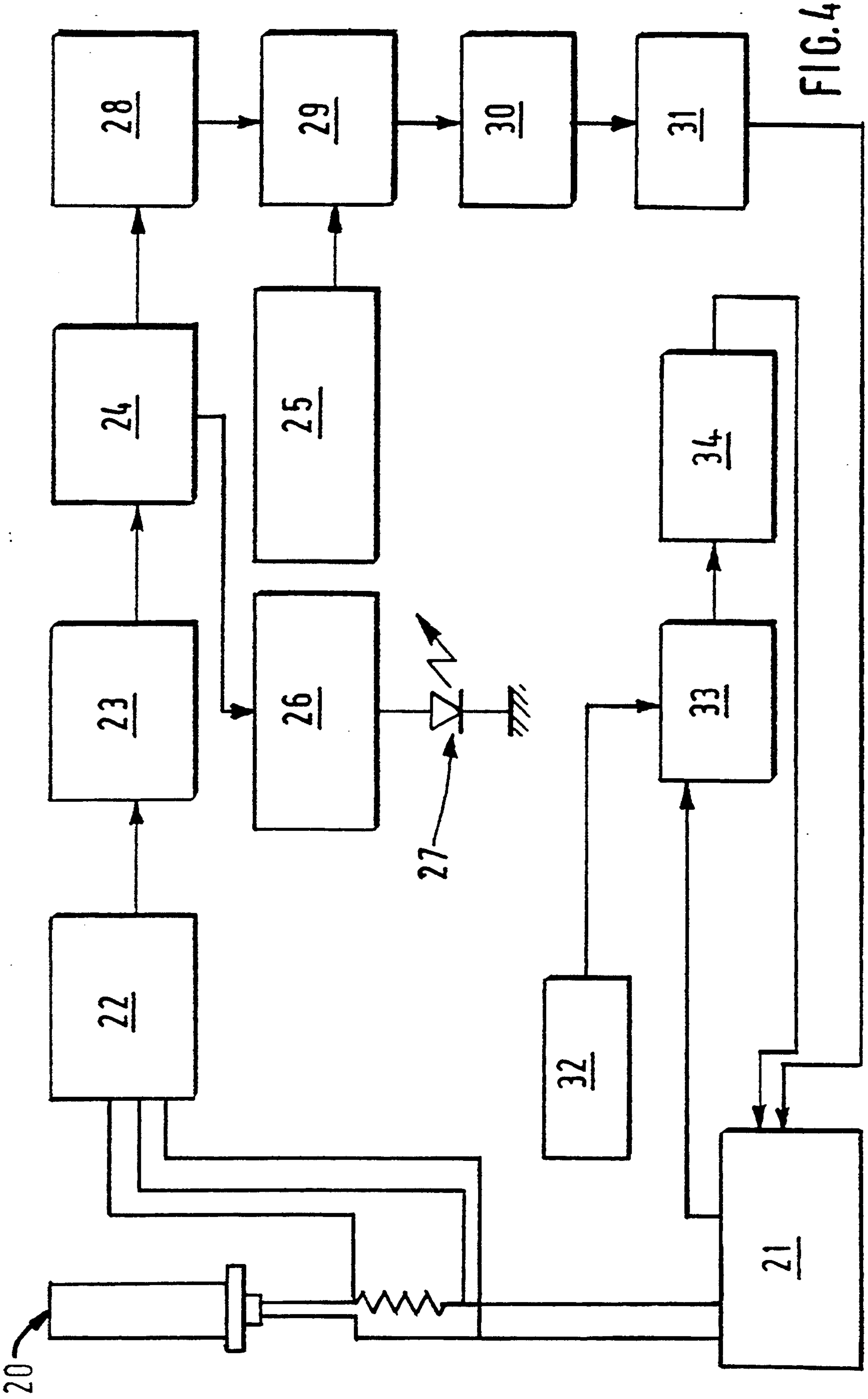
FIG. 4 shows, in the form of blocks, an outline diagram of one embodiment of the circuit for regulating the power supply to the device according to the present invention.

FIG. 4, to which reference is now made, shows, in the form of functional blocks, one embodiment of the circuit for frequency and power regulation of the power supply 20 to the ECR 21. The frequency regulation is achieved by means of a phase locking loop whose input stage 22 is a circuit in which the signals representing the voltage and current at the terminals of the ECR are shaped. In this stage the said current and voltage signals are shaped as a square signal. These signals are then transmitted to a phase comparator 23 which produces a voltage proportional to the phase difference between the voltage and current at the terminals of the ECR. The phase signal coming from the comparator 23 is then integrated by means of an integrator 24. When the system is started up, the operator enters a preliminary adjustment frequency 25. During this preliminary adjustment, the phase signal coming from the integrator is transmitted to a window comparator 26, which compares the signal which is sent to it with two predetermined thresholds, corresponding to the upper and lower limits of the preliminary adjustment desired. If the value of the input signal is between these two thresholds, an indicator, for example a visual indicator of the light emitting diode type 27, informs the operator that the preliminary adjustment has been carried out correctly.

Advantageously, this preliminary adjustment is replaced by an automatic and continuous adjustment process. To this end, the sign of the phase difference between the current and the voltage at the terminals of the ECR is measured. Depending on the sign of said phase difference, a counter is incremented or decremented. Said counter controls a digital-to-analog converter (DAC), which in turn provides an adjustment voltage. Said voltage which is continuously self-adjusted, replaces the preliminary adjustment voltage, entered by the operator in the above mentioned embodiment, said counter being incremented or decremented until the phase difference be within a given range defined by the said two predetermined thresholds. Such a correction system, of the integral type, allows to correct at any time for any resonant frequency drift, whatever the origin of said drift is (T°, wear of the ECR horn). Furthermore, said counter can be reset if the amplitude difference between the current and voltage signals is greater than a given value. A difference greater than said value would in fact imply that said regulation loop is locked on a frequency for which the efficiency is non maximal. As an example, a sharp variation of the frequency in the processing chamber could cause the locking of the regulation loop on the parallel resonant frequency for which the efficiency is minimal. The reset of said counter allows to lock again the regulation loop on the series resonant frequency for which the efficiency is maximal.

According to the embodiment described here, the voltage coming from the integrator 24 varies in fact between 0 volts for x degrees of negative phase difference and 15 volts for x degrees of positive phase difference. This signal is transmitted to a phase shifter 28 to be realigned on 0 volts. The signal then varies between −7.5 V and +7.5 V. This signal is then added to the preliminary adjustment voltage supplied by the operator to the continuously self adjusted voltage provided by the DAC, by means of an adder 29. The resulting voltage feeds a voltage controlled oscillator (VCO) 30 which in response produces a frequency of between 38 and 43 kHz. This frequency, through an output stage 31, feeds the power part of the power supply 20.

Thus, after carrying out the required preliminary adjustment, the power supply adapts automatically in frequency according to the operating parameters of the system, and this in a continuous fashion.

After this description of the frequency regulation stage, the power regulation stage will now be described. The operator enters a power reference input 32 and this reference input is compared 33 with the power actually supplied to the ECR by the power supply 20. The power actually supplied by the power supply is measured, for example, by means of a wattmeter board. The resulting error voltage supplies a power variator 34 of the dimmer type, which itself feeds the power stage of the power supply 20 so as to cancel out continuously the said error voltage.

This regulation loop enables the power supply to be adapted in respect of the power whatever the characteristics (Viscosity, temperature) of the composition to be processed.

Such a regulation, both in frequency and power at the same time, makes it possible to avoid the use of auxiliary debubbling devices as mentioned previously, thus limiting the cost of the equipment and its maintenance. Such a simplification also results in a reduction in head losses.

The examples described in the present application constitute only some possible embodiments of the present invention. It is obvious, notably with respect to the regulation loops, that other arrangements achieving the same functions can be proposed.

I claim:

1. Device enabling gas bubbles contained in a liquid composition to be dissolved, comprising:

a) a chamber (10) provided with an inlet orifice (11) through which the composition to be debubbled is introduced, and an outlet orifice (12) through which the debubbled composition is discharged;

b) an ultrasonic transducer (13, 14, 15, 16, 17, 18, 19, 20) inducing an alternating pressure field inside said chamber;

c) a power supply (21) coupled to said ultrasonic transducer for providing terminals of said transducer with a voltage and a current having an adjustable frequency wherein the liquid composition, the chamber and the ultrasonic transducer have a series resonant frequency and a parallel resonant frequency;

d) adjusting means for carrying out a preliminary adjustment of said frequency, said adjusting means having i) means for measuring the sign of the phase difference between the current and voltage at the terminals of the ultrasonic transducer, and ii) means for, depending on said sign, incrementing or decrementing a counter which controls accordingly said adjustable frequency of said power supply, said counter being incremented or decremented until said phase difference be within a predetermined range, wherein a preliminary adjusted frequency of said power supply is produced; and e) means for continuously regulating said power and said preliminary adjusted frequency of said power supply to match said series resonant frequency and to provide a continuous adaptation of the amplitude of said alternating pressure field, said preliminary adjusted frequency and said power being independently regulated.

2. Device according to claim 1, characterized in that said means for regulating said power supply in frequency and power comprises means for measuring the phase difference between the current and voltage at the terminals of the ultrasonic transducer.

3. Device according to claim 1 further comprising means for resetting said counter each time the amplitude difference between said voltage and said current is greater than a given value.

4. Device according to claim 1, characterized in that the power supply frequency varies between 38 and 43 kHz.

5. Device according to claim 1, characterized in that the said chamber (10) is made from stainless steel.

6. Device according to claim 1, characterized in that the said liquid composition is a photographic composition.

7. Device according to claim 1, characterized in that the ultrasonic transducer has a structure of the Langevin triplet type.

* * * * *